United States Patent [19]

Lee

[11] Patent Number: 5,708,383
[45] Date of Patent: Jan. 13, 1998

[54] INTEGRATED CIRCUIT FREQUENCY CONTROLLED MODULATOR FOR USE IN A PHASE LOCK LOOP

[76] Inventor: Johnny Chuang-Li Lee, 2483 Gallup Dr., Santa Clara, Calif. 95051

[21] Appl. No.: 638,553

[22] Filed: Apr. 26, 1996

[51] Int. Cl.$^6$ .......................... G06F 7/163; H03L 71/099
[52] U.S. Cl. .......................... 327/356; 327/355; 327/359; 327/113; 327/105; 327/156
[58] Field of Search ...................... 327/113, 103, 327/114, 116, 147, 156, 355, 356, 357, 358, 359, 105, 244

[56] References Cited

U.S. PATENT DOCUMENTS

| | | | |
|---|---|---|---|
| 5,122,687 | 6/1992 | Schmidt | 327/359 |
| 5,132,633 | 7/1992 | Wong et al. | 328/14 |

OTHER PUBLICATIONS

Zhenhua Wang, "A four–Transistor Four–Quandrant Analog Multiplier Using MOS Transistors Operating in the Saturation Region", published in *IEEE Transactions on Instrumentation and Measurement*, vol. 42, No. 1, Feb. 1993, pp. 75–77.

Paul Gray and Robert Meyer, *Analysis and Design of Analog Integrated Circuits*, 3rd Edition, published by John Wiley & Sons, Inc., dated 1993, pp. 667–676 no month.

*Primary Examiner*—Timothy P. Callahan
*Assistant Examiner*—Dinh T. Le
*Attorney, Agent, or Firm*—Limbach & Limbach L.L.P.

[57] ABSTRACT

A circuit for modulating an N-phase first waveform having a frequency $F_O$ with an N-phase second waveform having a frequency $F_M$. The circuit includes N number of limited swing driver circuits. Each limited swing driver circuit has generator means for generating one phase of a third waveform in response to one phase of the first waveform so that the third waveform has a frequency $F_O$ and a voltage swing that is less than a voltage swing of the first waveform. The circuit also includes N number of multiplier circuits. Each multiplier circuit is coupled to one of the limited swing driver circuits and has multiply means for multiplying one phase of the third waveform with one phase of the second waveform and for generating first and second currents having a difference which is proportional to a product of the one phase of the third waveform and the one phase of the second waveform. A load circuit is coupled to the multiplier circuits and has a first node into which the first currents generated by each of the multiplier circuits are summed together to form a first summation current and a second node into which the second currents generated by each of the multiplier circuits are summed together to form a second summation current. The load circuit has a comparing stage for comparing which of the first and second summation currents is larger and for generating a first clock signal having a frequency approximately equal to a frequency of a change in magnitude of the first and second summation currents. A method of modulating an N-phase first waveform having a frequency $F_O$ with an N-phase second waveform having a frequency $F_M$ is also disclosed.

26 Claims, 7 Drawing Sheets

INTEGRATED CIRCUIT FREQUENCY CONTROLLED MODULATOR FOR USE IN A PHASE LOCK LOOP

BACKGROUND OF THE INVENTION

1. Field of the Invention

The present invention is related to phase-locked loops (PLLs), and particularly, to a high speed frequency controlled modulator for use in PLLs.

2. Description of the Related Art

Referring to FIG. 1, there is shown a high frequency, phase-locked loop (PLL) 20. The PLL 20 is described in U.S. Pat. No. 5,132,633 to Wong et al. entitled "PLL Using a Multi-Phase Frequency Correction Circuit in Place of a VCO", the contents of which are hereby fully incorporated into the present application by reference.

One function of the PLL 20 is to generate a periodic clock signal $F_{OUT}$ which matches the frequency of the input signal $F_{IN}$. Generating the clock signal $F_{OUT}$ is essential for accurately decoding the incoming digital data signals included in the input signal $F_{IN}$. Specifically, the PLL 20 is of the clock/data recovery type because it recovers the clock from the input signal $F_{IN}$ which includes both the digital data and the clock.

The primary components of the PLL 20 are a phase error detector 22, an N-phase waveform synthesizer 24, an N-phase ring oscillator 26, and a frequency correction circuit 28. The N-phase ring oscillator 26 generates N equally phase spaced high frequency, e.g., above 50 MHz, local clock signals $V_{c1}$ to $V_{cN}$ having frequency $F_O$. The N-phase waveform synthesizer 24 generates N equally phase spaced low frequency control signals $V_{x1}$ to $V_{xN}$ having frequency $F_M$. The frequency $F_M$ corresponds to the frequency error between the local clock frequency $F_O$ and the input signal frequency $F_{IN}$. In the PLL 20 shown in FIG. 1, N is equal to three. Thus, there are three high frequency phasers $V_{c1}$, $V_{c2}$ and $V_{c3}$, and there are three low frequency control phasers $V_{x1}$, $V_{x2}$ and $V_{x3}$. However, it should be understood that N could be another number.

The phase error detector 22 continually compares the phase of the output signal $F_{OUT}$ with the phase of the input signal $F_{IN}$, generating a phase error signal $\Theta$ which is used by the waveform synthesizer 24 to adjust the frequency $|F_M|$ of the N control signals $V_{x1}$ to $V_{xN}$, as well as the leading/lagging phase relationship among those control signals. The frequency correction circuit 28 generates the output signal $F_{OUT}$ whose frequency is equal to $F_O \pm F_M$ so that the output frequency $F_{OUT}$ closely matches a predefined integer multiple of the input frequency $F_{IN}$.

One use for the PLL 20 is in a 125 megabit per second Fast Ethernet and Fiber Distributed Data Interface (FDDI) system. In this scenario the reference frequency $F_O$ of the local clock signals $V_{c1}$ to $V_{c3}$ could be 125 MHz. However, it is preferable to use a 250 MHz clock and a divide-by-two circuit to ensure data detection symmetry. Furthermore, in clock/data recovery applications the reference local clock frequency $F_O$ typically will differ from the input frequency by no more than a factor of one in a thousand. Although the locking range may be as large one part in ten, the maximum value of $F_M$ is usually low enough to allow the use of low cost digital waveform synthesizers for generating the control signals $V_{x1}$ to $V_{x3}$. For Fast Ethernet and FDDI applications, the locking range is very narrow which allows the use of a waveform synthesizer 24 with a maximum $F_M$ of 162.76 KHz, providing a symmetric locking range of 250 MHz ±162.76 KHz.

Referring to FIG. 2, there is shown a block diagram illustrating the basic function performed by the frequency correction circuit 28. The frequency correction circuit 28 is a circuit in which two clock signals, namely $V_x$ and $V_c$, are mixed together to obtain an output clock signal. The output clock signal oscillates at a frequency which is the sum or difference of the two input clock frequencies $F_M$ and $F_O$. A typical application of the frequency correction circuit 28 is as shown in the PLL 20 where a variable frequency output is achieved by modulating a high frequency reference clock $V_c$ by a low frequency clock signal $V_x$.

The frequency correction circuit 28 basically performs three multiply operations 30, 32, 34 and an addition operation 36. The principal of the modulator works as in FM radio where a low frequency signal $V_x$ is multiplied in the time domain with a high frequency carrier wave $V_c$. The result is that the carrier frequency is shifted by the lower modulating frequency $F_M$. In this application, three phases of the clocks each 120° apart, i.e., $V_{x1}$, $V_{x2}$, $V_{x3}$ and $V_{c1}$, $V_{c2}$ and $V_{c3}$, are multiplied together and summed.

It would be desirable for the frequency correction circuit 28 to be implemented in a high speed, low power consumption integrated circuit. However, the specific circuit implementation for the frequency correction circuit 28 which is described in U.S. Pat. No. 5,132,633 employs ECL components having termination resistors on the ECL gates. This implementation has the disadvantages of high power consumption, a wide operating voltage range, and slow multiply speed. In short, the specific circuit design described in U.S. Pat. No. 5,132,633 for the frequency correction circuit 28 is impractical for use in a high speed, low power consumption integrated circuit environment.

Referring to FIG. 3, there is shown a four-quadrant analog multiplier circuit 38 which could be used to perform the three multiply operations 30, 32, 34 shown in FIG. 2. The multiplier circuit 38 is described in a paper entitled "A Four-Transistor Four-Quadrant Analog Multiplier Using MOS Transistors Operating in the Saturation Region" published in *IEEE Transactions on Instrumentation and Measurement*, Vol. 42, No. 1, February 1993. The multiplication is performed with four MOS transistors M1, M2, M3, M4 which at first appear to make it suitable for integrated circuit implementation. However, the multiplier circuit 38 is plagued by several disadvantages which render it impractical for silicon implementation directly. Specifically, the design is for a discrete board implementation with resistive loads for the multiplier, and the resistive loads slow down the overall multiply speed. Furthermore, the circuit requires a wide operating voltage range and produces a high quiescent current which the resistive loads do not absorb efficiently. Because of the high quiescent current, the multiplier output voltage sensitivity is decreased. The multiplier output sensitivity is decreased because the high quiescent current cuts down on the voltage headroom within which all of the components operate. Furthermore, the resistive loads not only slow the device down, but they also tend to use up voltage headroom. When there is less headroom, the voltage amplitude of the output will be less and thus more prone to noise.

Another prior art analog multiplier is the Gilbert Cell which is described in the text book by Paul Gray and Robert Meyer entitled "Analysis and Design of Analog Integrated Circuits", 3rd Edition, Published by Wiley, pp. 667–675. The Gilbert Cell also has disadvantages. Although the Gilbert Cell does not have a high quiescent current, it does require three different levels of MOS threshold voltage $V_T$ which increases the required voltage headroom. Furthermore, the Gilbert Cell also utilizes resistive loads.

3

Thus, there is a need for more practical circuit design for a frequency controlled modulator that is particularly suited for an integrated circuit environment.

SUMMARY OF THE INVENTION

The present invention provides a circuit for modulating an N-phase first waveform having a frequency $F_O$ with an N-phase second waveform having a frequency $F_M$. The circuit includes N number of multiplier circuits. Each multiplier circuit has multiply means for multiplying one phase of the first waveform with one phase of the second waveform and for generating first and second currents having a difference which is proportional to a product of the one phase of the first waveform and the one phase of the second waveform. A load circuit is coupled to the multiplier circuits. It has a first node into which the first currents generated by each of the multiplier circuits are summed together to form a first summation current and a second node into which the second currents generated by each of the multiplier circuits are summed together to form a second summation current. The load circuit has a comparing stage for comparing which of the first and second summation currents is larger and for generating a first clock signal having a frequency approximately equal to a frequency of a change in magnitude of the first and second summation currents.

The present invention also provides a circuit for modulating an N-phase first waveform having a frequency $F_O$ with an N-phase second waveform having a frequency $F_M$ similar to above, but which also includes, N number of limited swing driver circuits. Each limited swing driver circuit has generator means for generating one phase of a third waveform in response to one phase of the first waveform so that the third waveform has a frequency $F_O$ and a voltage swing that is less than a voltage swing of the first waveform.

The present invention also provides a method of modulating an N-phase first waveform having a frequency $F_O$ with an N-phase second waveform having a frequency $F_M$. The method includes the steps of: generating an N-phase third waveform having a frequency $F_O$ and a voltage swing that is less than a voltage swing of the first waveform; multiplying each phase of the third waveform with each respective phase of the second waveform; generating first and second currents with respect to each phase of the multiplied third and second waveforms having a difference which is proportional to a product of the respective phases of the third and second waveforms; summing together the first currents generated with respect to each phase of the multiplied third and second waveforms to form a first summation current; summing together the second currents generated with respect to each phase of the multiplied third and second waveforms to form a second summation current; comparing which of the first and second summation currents is larger; and generating a first clock signal having a frequency approximately equal to a frequency of a change in magnitude of the first and second summation currents.

A better understanding of the features and advantages of the present invention will be obtained by reference to the following detailed description of the invention and accompanying drawings which set forth an illustrative embodiment in which the principles of the invention are utilized.

4

Figure 1:
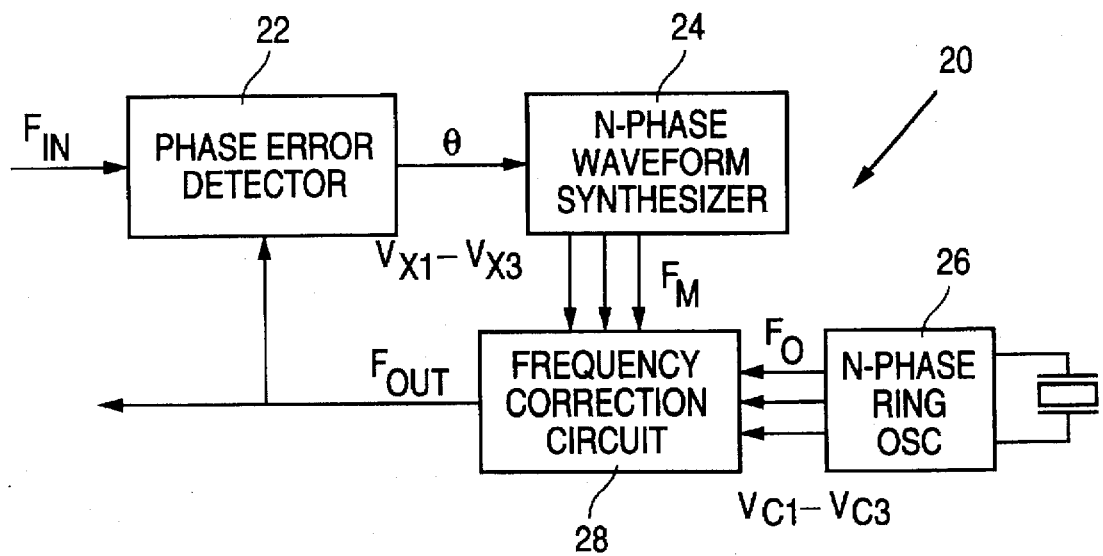
FIG. 1 is a block diagram illustrating a prior art phase-locked loop.
Figure 2:
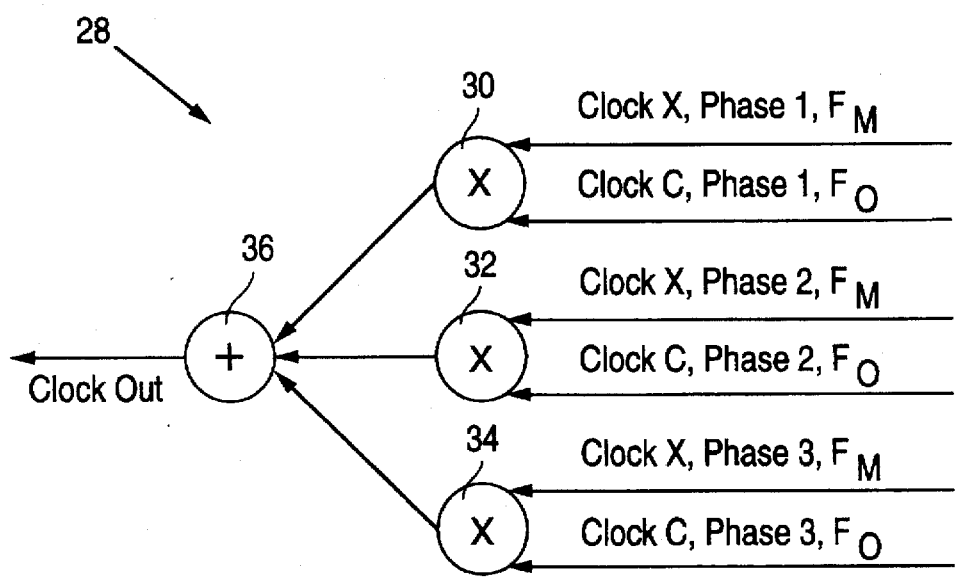
FIG. 2 is a block diagram illustrating a frequency correction circuit which may be used for the one shown in FIG. 1.
Figure 3:
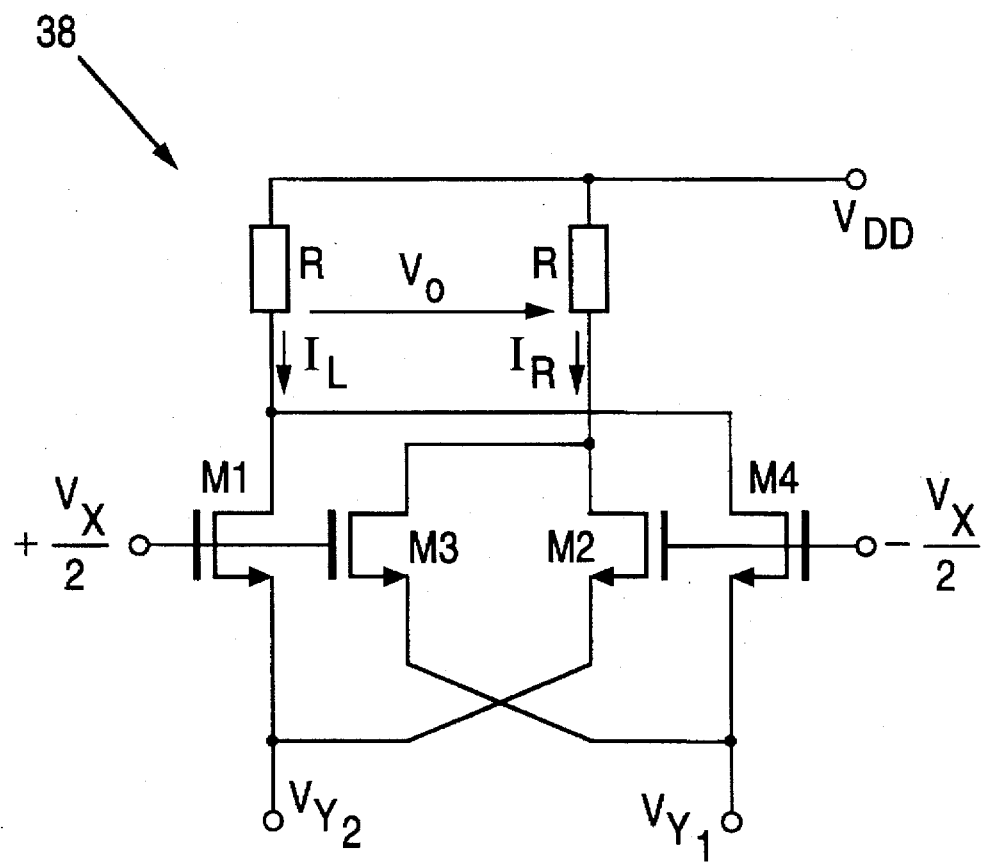

FIG. 3 is a schematic diagram illustrating a prior art multiplier circuit.

Figure 4:
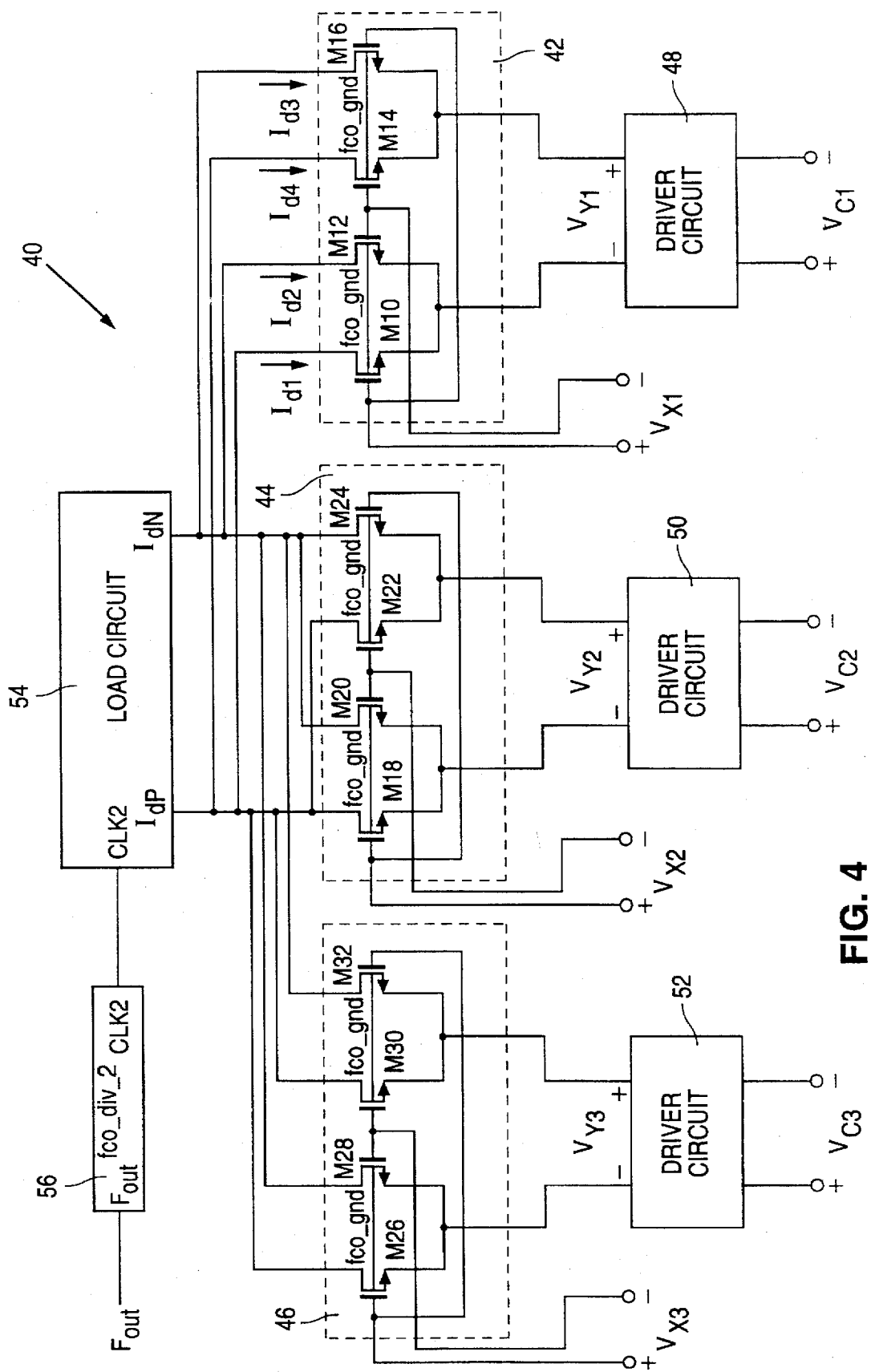

FIG. 4 is a schematic diagram illustrating a frequency controlled modulator in accordance with the present invention.

Figure 5:
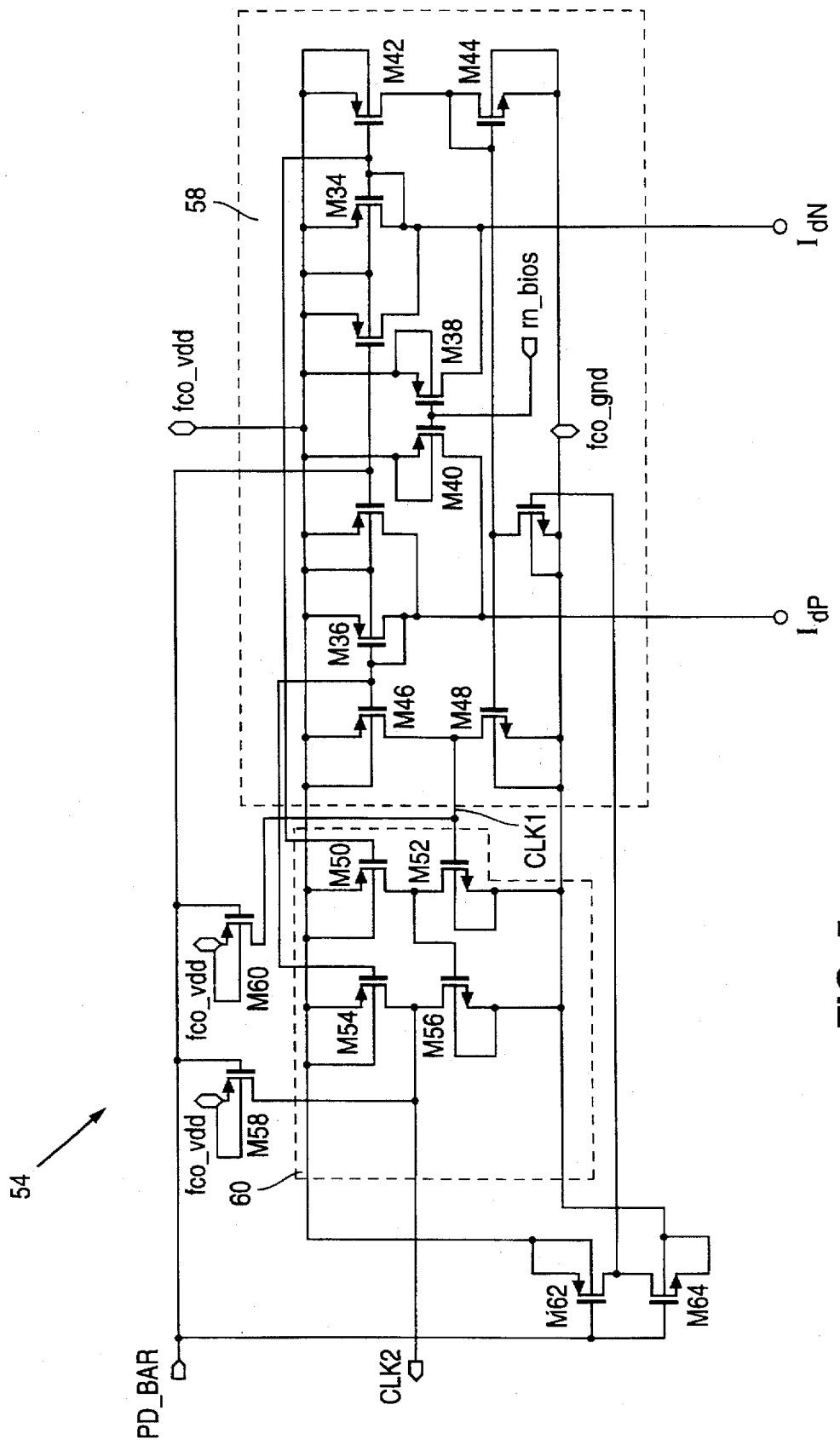

FIG. 5 is a schematic diagram illustrating the load circuit shown in FIG. 4.

Figure 6:
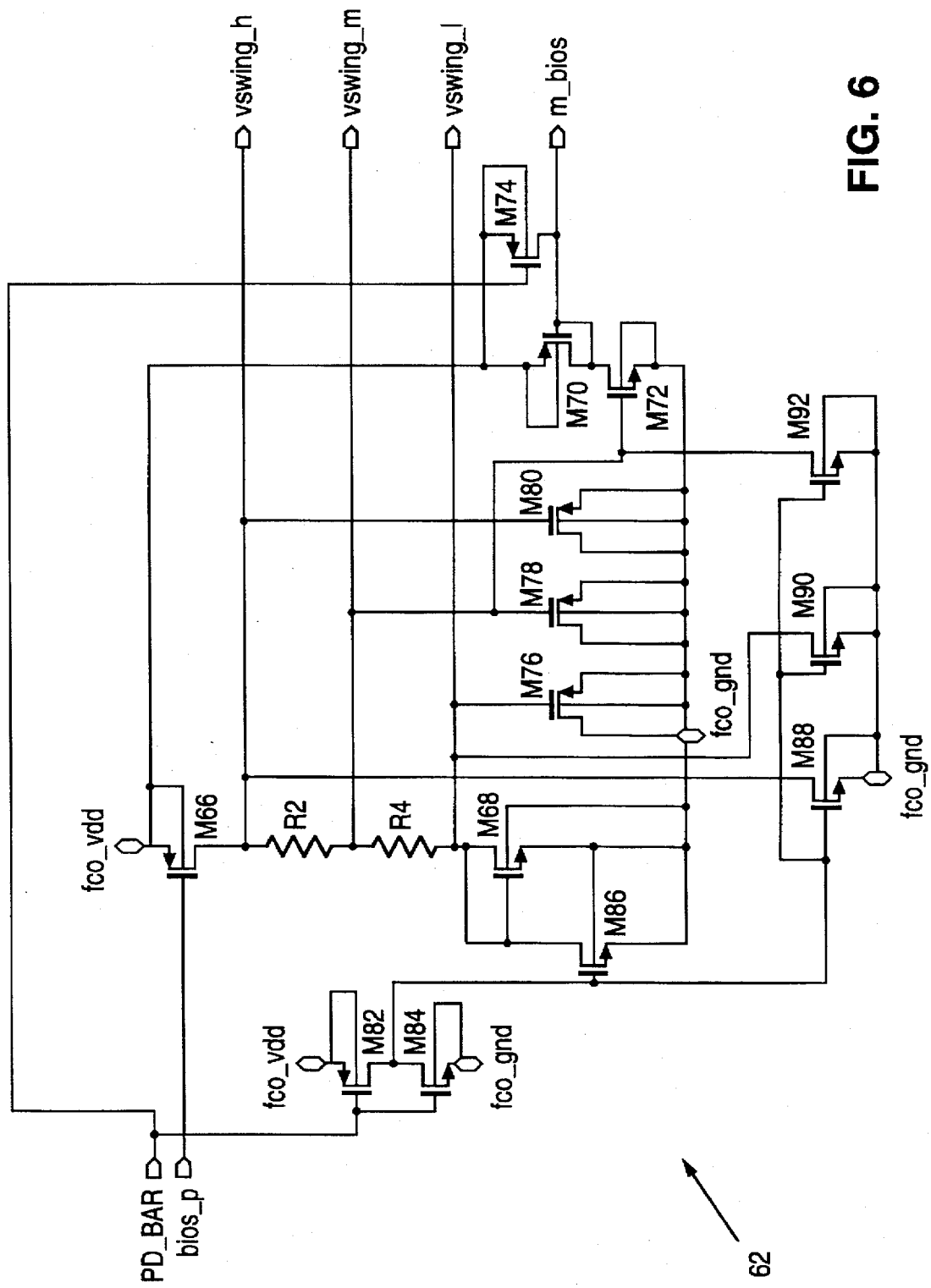

FIG. 6 is a schematic diagram illustrating the FCO voltage swing reference generator used to generate the m_bias voltage shown in FIG. 5.

Figure 7:
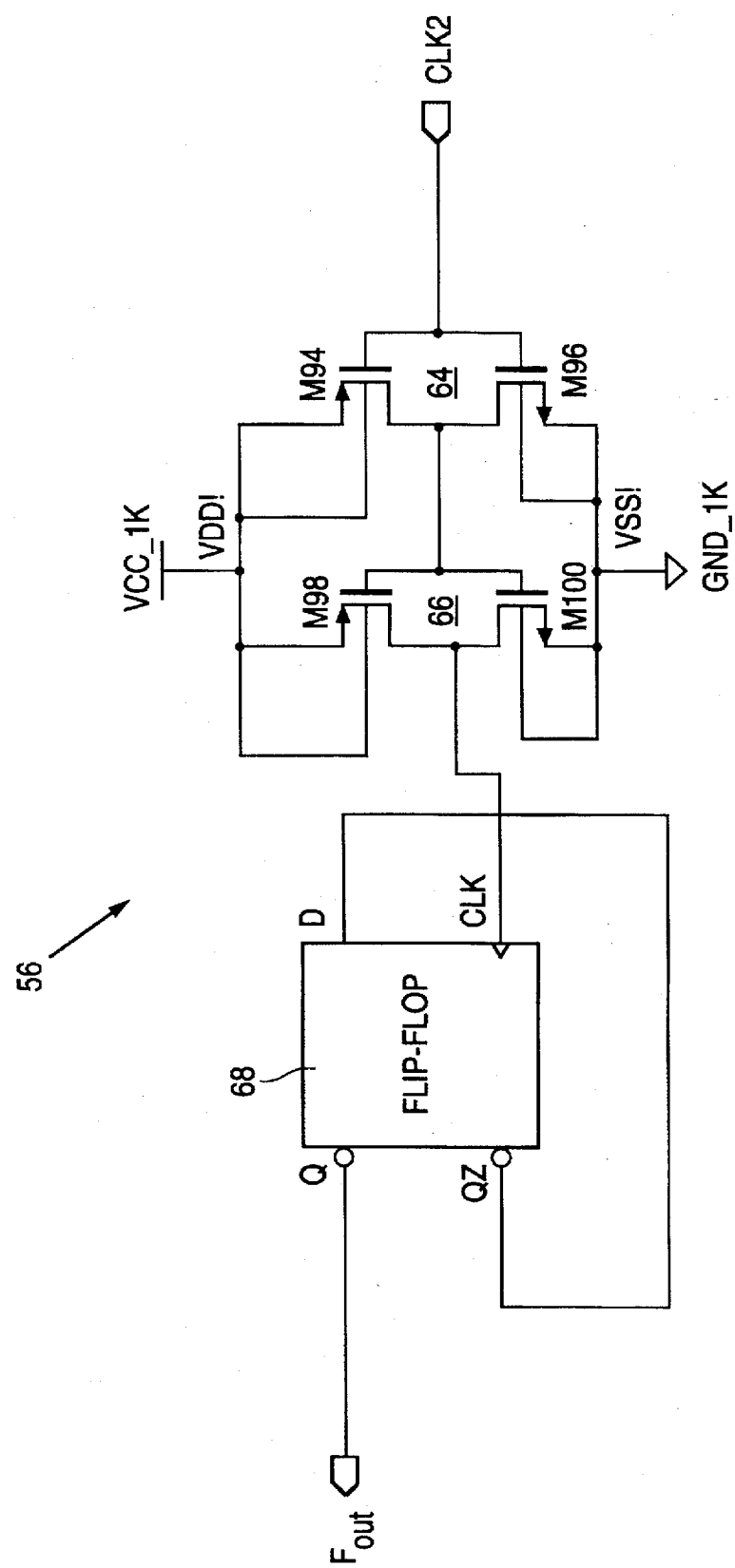

FIG. 7 is a schematic diagram illustrating the divide by two circuit shown in FIG. 4.

Figure 8:
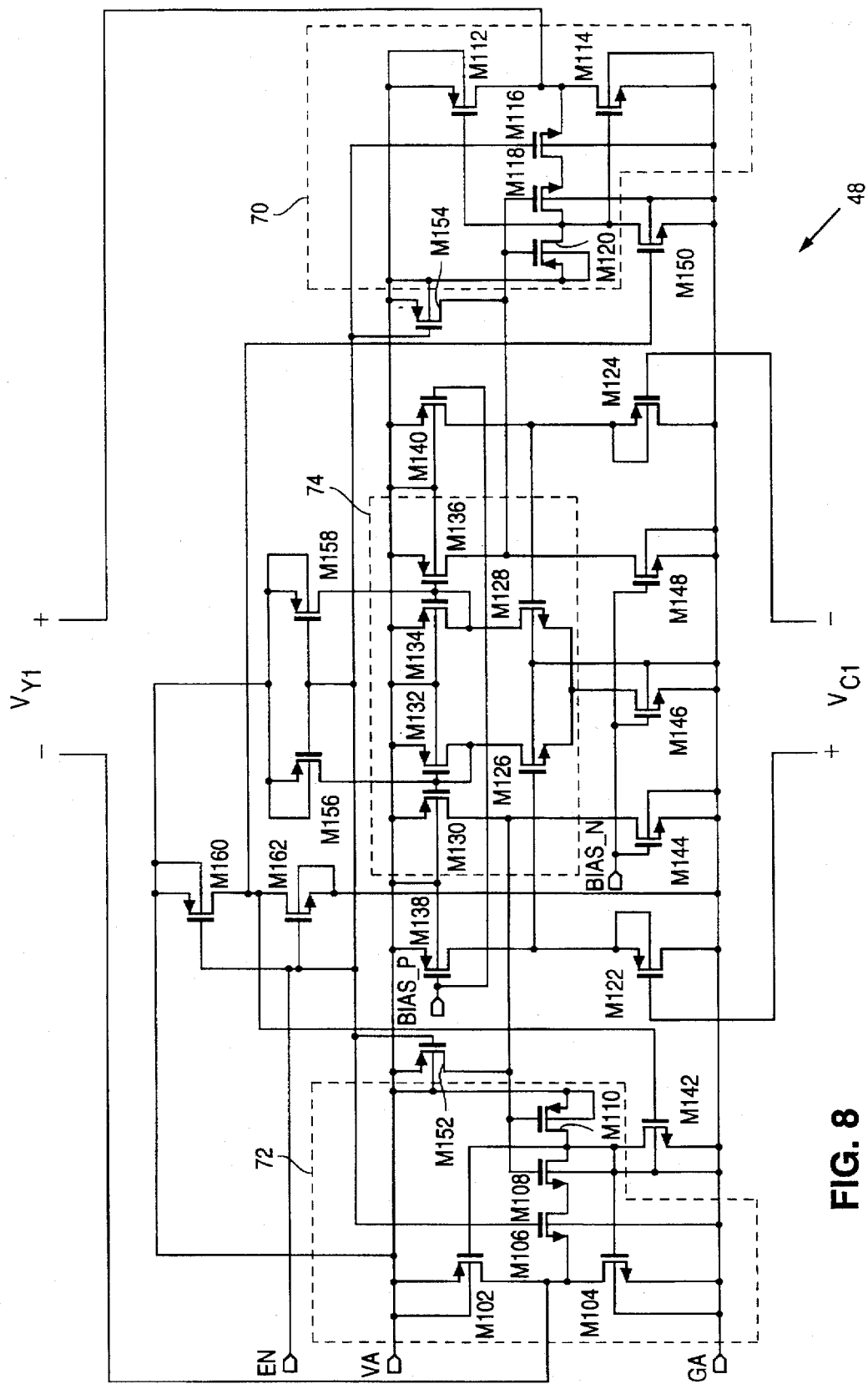

FIG. 8 is a schematic diagram illustrating one of the limited swing clock driver circuits shown in FIG. 4.

DETAILED DESCRIPTION OF THE INVENTION

Referring to FIG. 4, there is shown a frequency controlled modulator (FCM) 40 in accordance with the present invention. The FCM 40 is constructed from MOS circuitry and is particularly suited for implementation in a high speed, low power consumption integrated circuit. The circuit includes three multiplier circuits 42, 44, 46, three limited swing clock driver circuits 48, 50, 52, a load circuit 54, and a divide by two circuit 56.

The FCM 40, which may also be referred to as a frequency controlled oscillator (FCO), functions similarly to the frequency correction circuit 28 discussed above. In general, the FCM 40 receives three equally phase spaced high frequency local clock signals $V_{c1}$ to $V_{c3}$ having frequency $F_O$ and three equally phase spaced low frequency control signals $V_{x1}$ to $V_{x3}$ having frequency $F_M$. A variable frequency output $F_{OUT}$ is achieved by modulating a high frequency reference clock $V_c$ by a low frequency clock signal $V_x$, hence the name frequency controlled modulator. Three phases of the inputs are used for proper side band cancellation because the input clock waveforms might not be pure sinusoids. In fact, they can be square waves and triangular waves with this three phase method. Specifically, the high frequency inputs $V_{c1}$ to $V_{c3}$ may be square or sinusoid clock waveforms, while the low frequency modulating inputs $V_{x1}$ to $V_{x3}$ may be triangular waveforms.

The limited swing clock driver circuits 48, 50, 52 receive the clock waveforms $V_{c1}$, $V_{c2}$, $V_{c3}$, respectively, which may have a variety of voltage swing ranges, and generate the partial swing clock waveforms $V_{y1}$, $V_{y2}$, $V_{y3}$, respectively, which have a fixed, constant voltage swing of about 0 to 1 volt. The clock waveforms $V_{c1}$, $V_{c2}$, $V_{c3}$ preferably have a voltage swing of about 0.3 volt to 1.5 volt. However, whether the clock waveforms $V_{c1}$, $V_{c2}$, $V_{c3}$ have a 0.3 volt to 1.5 volt swing, a full CMOS voltage swing, or some other swing range, the partial swing clock waveforms $V_{y1}$, $V_{y2}$, $V_{y3}$, will have a 0 volt to 1.0 volt swing. Another purpose of the limited swing clock driver circuits 48, 50, 52 is to provide drive current to the multiplier circuits 42, 44, 46. Such added drive current is advantageous because the input clock waveforms $V_{c1}$, $V_{c2}$, $V_{c3}$ may not be able to drive the current requirements of the Y-input of the multiplier circuits 42, 44, 46.

The three multiplier circuits 42, 44, 46 multiply the respective pairs of $V_{c1}$, $V_{c2}$, $V_{c3}$ and $V_{x1}$, $V_{x2}$, $V_{x3}$. The results of the multiplications are summed up into the two currents $I_{dP}$ and $I_{dN}$. The load circuit 54 amplifies the current difference between $I_{dP}$ and $I_{dN}$ and outputs a clock signal CLK2. The divide by two circuit 56 divides the clock signal CLK2 by two to generate $F_{OUT}$.

The three multiplier circuits 42, 44, 46 are modified versions of the multiplier circuit 38 shown in FIG. 3. Specifically, the disadvantages of the multiplier circuit 38 discussed above have been overcome in adapting the multiplier circuits 42, 44, 46 for silicon use. Referring to the first multiplier circuit 42, it includes four NMOS transistors M10, M12, M14, M16 connected in a cross-coupled manner, as shown. The voltages $V_{x1}$ and $V_{y1}$ are the two voltage inputs which are multiplied together. As will be discussed below, the voltage $V_{y1}$ is the output of the limited swing clock driver circuit 48. The result of the multiplication is embedded into the four currents id1, id2, id3, and id4 as follows:

$$id1 = K(V_{x1+} - V_{y1+} - V_{TN})^2$$

$$id2 = K(V_{x1-} - V_{y1+} - V_{TN})^2$$

$$id3 = K(V_{x1+} - V_{y1-} - V_{TN})^2$$

$$id4 = K(V_{x1-} - V_{y1-} - V_{TN})^2$$

From these four basic equations the following two equations can be derived:

$$id1 - id2 = K(V_{x1+}^2 - V_{x1-}^2 - 2(V_{y1+} - V_{TN})(V_{x1+} - V_{x1-}))$$

$$id3 - id4 = K(V_{x1+}^2 - V_{x1-}^2 - 2(V_{y1-} - V_{TN})(V_{x1+} - V_{x1-}))$$

And from these two equations the following equation is derived:

$$(id1-id2)-(id3-id4) = -2K(V_{x1+} - V_{x1-})(V_{y1+} - V_{y1-}) = (id1+id4)-(id2+id3)$$

The above equations are the MOS saturation current equations neglecting channel length modulation. As can be seen, in the final equation the quantity (id1+id4)−(id2+id3) is proportional to the product of the differential input voltages $V_{x1}$ and $V_{y1}$.

Each one of the 4-transistor multipliers 42, 44, 46 multiplies one of the three phases of the $V_{c1}$, $V_{c2}$, $V_{c3}$ and $V_{x1}$, $V_{x2}$, $V_{x3}$ inputs, respectively. Furthermore, each one of the multipliers 42, 44, 46 generates four currents as described above. Two of the currents, id1 and id4, contribute positively to the final multiplied product, and the other two currents, id2 and id3, contribute negatively to the multiplied product. For the three multipliers 42, 44, 46 there are a total of six currents with positive contributions and a total of six currents with negative contributions. The six positively contributing currents are summed together into the summation current $I_{dP}$ by tying the drains of the n-channel transistors M14, M10, M22, M18, M30, M26 together. Similarly, the six negatively contributing currents are summed together into the summation current $I_{dN}$ by tying the drains of the n-channel transistors M12, M16, M24, M20, M32, M28 together.

By tying the drains of transistors M14, M10, M22, M18, M30, M26 together and the drains of transistors M12, M16, M24, M20, M32, M28 together the multiplication and addition arithmetic operations are combined which increases the overall speed of the circuit. Thus, the multiplication and summation operations of the modulation process is performed in one shot and the final result is embedded within the two currents $I_{dP}$ and $I_{dN}$. The difference between the two currents $I_{dP}$ and $I_{dN}$ yields the desired arithmetic result. Furthermore, only two levels of MOS threshold voltage are needed which overcomes the disadvantage of the Gilbert cell discussed above.

By way of example, transistors M10, M12, M14, M16, M18, M20, M22, M24, M26, M28, M30, M32 may each have a channel length of 4 micrometers (μm) and a channel width of 10 μm.

The load circuit 54 receives the two currents $I_{dP}$ and $I_{dN}$. Referring to FIG. 5, the two currents $I_{dP}$ and $I_{dN}$ are loaded by the current mirror load PMOS transistors M34, M36, which are part of the comparing stage 58 of the load circuit 54. Specifically, the multiplying transistors M10, M12, M14, M16, M18, M20, M22, M24, M26, M28, M30, M32 operate best when they are saturated. By using the current mirror load transistors M34, M36, such saturation can be achieved much easier. Furthermore, by using the current mirror load transistors M34, M36, the multiplied results are kept as currents. This increases the overall speed of the FCM 40. In contrast, with the prior an multiplier circuit 38 shown in FIG. 3, the resulting currents are loaded directly into the resistors R and immediately converted into a voltage $V_O$, which slows down the overall multiply speed.

By way of example, the PMOS transistors M34, M36, may have a channel length of 2 μm and a channel width of 30 μm, and the PMOS transistors M38, M40, may have a channel length of 2 μm and a channel width of 120 μm.

The transistors M38, M40 act as constant current loads to absorb the quiescent current included in the two currents $I_{dP}$ and $I_{dN}$, and the current mirror transistors M34, M36 act as part of the amplifier portion of the comparing stage 58 of the load circuit 54, discussed below. Specifically, the transistors M38, M40 divert a major portion of the DC component of the currents $I_{dN}$, $I_{dP}$, respectively, from multiplication, thus increasing the voltage sensitivity of the amplifying current mirror transistors M34, M36. As discussed above, the prior an multiplier circuit 38 shown in FIG. 3 has a decreased voltage sensitivity due to the high quiescent current.

One purpose of the comparing stage 58 is to compare the two currents $I_{dN}$, $I_{dP}$ and generate a first clock signal CLK1 having a frequency equal to the frequency of the change in magnitude of currents $I_{dN}$, $I_{dP}$. The waveforms for the currents $I_{dP}$, $I_{dN}$ are 180° out of phase with each other. The comparing stage 58 detects when the currents $I_{dN}$, $I_{dP}$ are equal and changes the state of the first clock signal CLK1 at these "cross-over" points, i.e., the points, where the waveforms for the currents $I_{dN}$, $I_{dP}$ cross-over each other.

Transistors M42, M44, M46, M48 serve as current difference amplifiers. As mentioned before, the result of the multiplication can be derived from the difference between the two positive and negative currents $I_{dP}$, $I_{dN}$. Transistors M42, M44, M46, M48 amplify the difference between the two currents $I_{dN}$, $I_{dP}$ and convert the difference into a voltage level CLK1. The current difference amplifier transistors M42, M44, M46, M48 are utilized to amplify that difference and derive the singled-ended voltage CLK1.

By way of example, transistors M42, M46 may have a channel length of 2 μm and a channel width of 30 μm, and the PMOS transistors M44, M48, may have a channel length of 2 μm and a channel width of 7.5 μm.

The current difference amplifier transistors M42, M44, M46, M48 function by pulling the output CLK1 high or low depending on whether one of the currents $I_{dP}$, $I_{dN}$ is larger than the other. The frequency at which the currents $I_{dP}$, $I_{dN}$ oscillate is the frequency of the output CLK1. Transistors M46, M48, M42, M44 serve to amplify the difference between currents $I_{dP}$, $I_{dN}$ and convert the difference into a voltage at CLK1. Transistor M34 mirrors the current $I_{dN}$ to M42. Transistor M44 attempts to mirror the current $I_{dN}$ to transistor M48, while transistor M36 attempts to mirror the current $I_{dP}$ to transistor M46. When the $I_{dP}$ is less than the current $I_{dN}$, the current through transistors M46, M48 will be approximately $I_{dP}$. Since transistor M48's gate voltage is at the higher level which corresponds to the higher current $I_{dN}$, the channel length modulation effect of transistor M48 will drive its drain voltage to a low output level, thus pulling the CLK1 output low. When the current $I_{dP}$ is much less than the current $I_{dN}$, transistor M48 will be driven into the linear region.

Conversely, when the current $I_{dP}$ is greater than the current $I_{dN}$, the current through transistors M46, M48 will be approximately $I_{dN}$. Because transistor M46's gate voltage is at the level which corresponds to the higher current $I_{dP}$, the channel length modulation effect of transistor M46 will drive its drain voltage to a high output level, thus pulling the CLK1 output high. When the current $I_{dP}$ is much greater than the current $I_{dN}$, transistor M46 will be driven into the linear region.

The voltage level at the output of the current difference amplifier transistors M42, M44, M46, M48, i.e., the CLK1 signal, is not a rail-to-rail full CMOS logic level. Therefore, the CLK1 signal is passed through an amplifier stage 60 which generates an output clock CLK2 having an increased the dynamic range over the CLK1 signal. The amplifier stage 60 includes two stages of inverting amplifier transistors M50, M52 and M54, M56. By way of example, transistor M50 may have a channel length of 1 μm and a channel width of 12 μm, transistor M52 may have a channel length of 1 μm and a channel width of 3 μm, transistor M54 may have a channel length of 1 μm and a channel width of 20 μm, and transistor M56 may have a channel length of 1 μm and a channel width of 5 μm.

Transistors M50, M52, M54, M56 serve as inverting amplifiers with transfer function compensation performed by tying the gates of the PMOS transistors M50, M54 to the gates of the PMOS current mirror load transistors M34, M36, respectively. The transfer function of the inverting amplifier M50, M52 and inverting amplifier M54, M56 is compensated such that the switching threshold of these inverting amplifiers is centered at the cross-over point of the two currents $I_{dP}$ and $I_{dN}$. To illustrate, assume that the current $I_{dP}$ is equal to the current $I_{dN}$, i.e., the two currents are at the cross-over point. In this scenario, the currents conducted by transistors M46, M42, M44, M48 are equal and the gate voltage of transistor M44 will be equal to the voltage at the CLK1 output. Because the gate voltage of transistor M50 is equal to the gate voltage of transistor M42, and the gate voltage of transistor M52 is equal to the gate voltage of transistor M44, the current conducted by transistors M50, M52 will be approximately the same. Thus, the output voltage at the drains of transistors M50, M52 will be at the switching point, i.e., between VCC and GND. Similarly, with respect to the inverting amplifier formed from transistors M54, M56, when the current $I_{dP}$ equals the current $I_{dN}$, the gate voltage of transistor M54 is equal to the gate voltage of transistor M50, and the gate voltage of transistor M56 is approximately equal to the gate voltage of transistor M52. Thus, the inverting amplifier M54, M56 will also be at its switching threshold.

Transistors M58, M60, M62, M64 form a power-down circuit for the load circuit 54 and are controlled by the PD_BAR input. By way of example, transistors M58, M60, M62, M64 may have a channel length of 1 μm and a channel width of 3 μm. These transistor sizes conserve layout area because the power-down circuit does not have to be fast.

The constant current load transistors M38, M40 provide a quiescent current cancellation scheme. Specifically, the summation currents IdP, IdN generated by the three multiplier circuits 42, 44, 46 may include dc and ac components. For example, assume that currents $I_{dP}$ and $I_{dN}$ vary from 450 to 550 μA. The dc component in this scenario will be 450 μA, and the ac component will be 0 to 100 μA. Preferably, however, for maximum speed and sensitivity in the multiplying and addition operations, the dc component should be 0 A. In order to cancel out the dc component, transistors M40, M38 each generate 450 μA. This way, the current conducted by each of the transistors M36, M34 is just the ac component, or 0 to 100 μA.

In order for transistors M38, M40 to supply the correct cancellation current, the gates of transistors M38, M40 are driven by an m_bias voltage level. Referring to FIG. 6, the m_bias voltage level is generated by an FCO voltage swing reference generator 62. The reference generator removes a significant amount of the dc component from the currents $I_{dP}$, $I_{dN}$. The amount of dc component which is included in the currents $I_{dP}$, $I_{dN}$ depends on the voltage level at the multiplier inputs, i.e., $V_{x1}$, $V_{x2}$, $V_{x3}$, and $V_{y1}$, $V_{y2}$, $V_{y3}$. In general, in order to approximate the dc component, the center voltage level of a $V_x$ input and a low value of a $V_y$ input are added together and multiplied by 3 (for 3 multipliers). This results in a rough estimate of the dc component. More specifically, a PMOS transistor M66 serves as a current source for providing a current through resistors R2, R4 which are of equal value, for example 4.4 KΩ. The voltage levels vswing_l, vswing_m, vswing_h are the low, medium, and high voltage levels, respectively, of the Vx inputs of the multipliers 42, 44, 46. Transistor M68 ensures that the voltage level of vswing_l is at least one threshold voltage $V_T$ above ground so that the transistors in the multipliers 42, 44, 46 remain turned on. The m_bias voltage level is generated by tapping the middle voltage level vswing_m via transistors M70, M72 and using that as the voltage bias. Thus, the current from the m_bias voltage level approximates the DC current content of the three multipliers 42, 44, 46.

By way of example, transistor M66 may have a channel length of 1.5 μm and a channel width of 24 μm, transistor M68 may have a channel length of 4 μm and a channel width of 10 μm, transistor M70 may have a channel length of 2 μm and a channel width of 60 μm, transistor M72 may have a channel length of 4 μm and a channel width of 10 μm, and transistors M76, M78, M50 may have channel lengths of 87 μm and channel widths of 70 μm.

Transistors M82, M84, M86, M88, M90, M92 form a power-down circuit for the reference generator 62 and are controlled by the PD_BAR input. By way of example, transistors M82, M84, M86, M88, M90, M92 may each have a channel length of 1 μm and a channel width of 3 μm.

Referring to FIG. 7, the divide by two circuit 56 includes two CMOS inverters 64, 66 formed from transistors M94, M96 and M98, M100, respectively. The inverters 64, 66 further amplify the CLK2 output. Furthermore, a D flip-flop 68 divides the frequency of the CLK2 output by two in order to generate the $F_{OUT}$ clock of the FCM 40.

As mentioned above, the limited swing clock driver circuits 48, 50, 52 receive the clock waveforms $V_{c1}$, $V_{c2}$, $V_{c3}$, respectively, which have a full CMOS voltage swing, and generate the partial swing clock waveforms $V_{y1}$, $V_{y2}$, $V_{y3}$, respectively, which have a voltage swing of about 0 to 1 volt. One reason for reducing the voltage swing of the outputs $V_{y1}$, $V_{y2}$, $V_{y3}$ is because they drive the drains of the transistors in the multipliers 42, 44, 46, respectively. In other words, with respect to the multiplier 42, the output $V_{y1}$ is coupled to the sources of transistors M10, M12, M14, M16. In order to keep transistors M10, M12, M14, M16 saturated, their source voltages cannot be permitted to go too high or else the gate-source voltages $V_{GS}$ will fall below the threshold level $V_T$ and the transistors will begin to turn off. By not allowing the output $V_{y1}$ to go above 1 volt, the gate-source voltage $V_{GS}$ will remain above the threshold voltage $V_T$, which will ensure that the transistors M10, M12, M14, M16 remain saturated.

Referring to FIG. 8, the limited swing clock driver circuit 48 receives the clock waveform $V_{c1}$ via two PMOS transistors M122, M124. The current conducted by transistors M122, M124 is also conducted by two PMOS transistors M138, M140. The sources of transistors M122, M124 are coupled to a comparator stage 74. The comparator stage 74 includes transistors M126, M128, M130, M132, M134, M136, all connected substantially as shown. Two buffer stages 70, 72 generates the partial swing clock waveform $V_{y1}$. The buffer stage 70 includes transistors M112, M114, M116, M118, M120, all connected substantially as shown. The buffer stage 72 includes transistors M102, M104, M106, M108, M110, all connected substantially as shown. Transistors M122, M138, M124, M140 form a voltage follower that shifts the level of the input voltage $V_{c1}$ so as to be acceptable by the differential pair M126, M128. Transistors M132, M134, M130, M140 amplify the input swing to a full rail-to-rail swing at the gates of transistors M110, M108, M120, M118.

During operation, when the input voltage $V_{c1}$ is positive, the gates of transistors M110, M108 will be at VCC and the gates of transistors M120, M118 will be at ground. Transistor M110 will be off while transistor M108 shorts the input and output of the inverter formed by transistors M102, M104. This will cause the voltage at the negative terminal of $V_{y1}$ to be approximately 1 volt. Furthermore, transistor M118 will be off while transistor M120 is on. This turns off output transistor M112 which forces the voltage at the positive terminal of $V_{y1}$ to be approximately 0 volt.

Similarly, when the input voltage $V_{c1}$ is negative, the gates of transistors M110, M108 will be at ground and the gates of transistors M120, M118 will be at VCC. Transistor M120 will be off while transistor M118 shorts the input and output of the inverter formed by transistors M112, M114. This will cause the voltage at the positive terminal of $V_{y1}$ to be approximately 1 volt. Furthermore, transistor M108 will be off while transistor M110 is on. This turns off output transistor M102 which forces the voltage at the negative terminal of $V_{y1}$ to be approximately 0 volt.

By way of example, transistors M122, M124, M126, M128 may have a channel length of 1.5 µm and a channel width of 20 µm, transistors M132, M134 may have a channel length of 1.5 µm and a channel width of 15 µm, transistors M130, M136 may have a channel length of 1 µm and a channel width of 40 µm, transistors M102, M112 may have a channel length of 1.5 µm and a channel width of 3 µm, transistors M104, M114 may have a channel length of 1 µm and a channel width of 30 µm, transistors M110, M120 may have a channel length of 1 µm and a channel width of 7 µm, and transistors M108, M118 may have a channel length of 1 µm and a channel width of 15 µm.

Transistors M106, M142, M152, M150, M116, M154, M160, M162, M156, M158 are for purposes of power-down. They may have channel lengths of 1 µm and channel widths of 3 µm.

When the FCM 40 is used in a PLL, the output frequency $F_{OUT}$ closely matches the input frequency of the PLL. Furthermore, the FCM 40 has many advantages over prior art circuits. For example, because the arithmetic operations are done with currents, the modulation function is compact and high speed. Because of the use of the limited swing clock driver circuits 48, 50, 52, the $V_{c1}$, $V_{c2}$, $V_{c3}$ inputs may have a wide input range. The multipliers 42, 44, 46 do not need their own bias. Finally, the MOS transistor design and the use of the four transistor multipliers 42, 44, 46 make for a high speed FCM.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A circuit for modulating an N-phase first waveform having a frequency $F_O$ with an N-phase second waveform having a frequency $F_M$, comprising:

N number of multiplier circuits, each multiplier circuit having multiply means for multiplying one phase of the first waveform with one phase of the second waveform and for generating first and second currents having a difference which is proportional to a product of the one phase of the first waveform and the one phase of the second waveform;

a load circuit, coupled to the multiplier circuits, having a first node into which the first currents generated by each of the multiplier circuits are summed together to form a first summation current and a second node into which the second currents generated by each of the multiplier circuits are summed together to form a second summation current, the load circuit having a comparing stage for comparing which of the first and second summation currents is larger and for generating a first clock signal having a frequency approximately equal to a frequency of a change in magnitude of the first and second summation currents; and N number of limited swing driver circuits, each limited swing driver circuit being coupled to a different one of the multiplier circuits and having generator means, responsive to one phase of a third N-phase waveform, for generating the one phase of the first waveform to have a voltage swing that is less than a voltage swing of the third waveform.

2. A circuit in accordance with claim 1, wherein the comparing stage of the load circuit comprises:

a first transistor coupled to the first node for conducting a first portion of the first summation current;

a second transistor coupled to the second node for conducting a first portion of the second summation current; and a current difference amplifier coupled to the first and second transistors for converting a difference between the first portion of the first summation current and the first portion of the second summation current into the first clock signal.

3. A circuit in accordance with claim 1, wherein the load circuit further comprises:

an amplifier stage coupled to the comparing stage for amplifying the first clock signal to generate a second clock signal having an increased amplitude.

4. A circuit in accordance with claim 1, wherein the multiply means of each multiplier circuit comprises:

first, second, third and fourth transistors which each have a gate, drain and source, the gates of the first and second transistors being coupled together, the gates of the third and fourth transistors being coupled together, the sources of the first and third transistors being coupled together, and the sources of the second and fourth transistors being coupled together;

wherein the one phase of the second waveform is applied between the gates of the first and third transistors and the one phase of the first waveform is applied between the sources of the first and second transistors;

wherein the drains of the first and fourth transistors conduct the first current and the drains of the second and third transistors conduct the second current.

5. A circuit for modulating an N-phase first waveform having a frequency $F_O$ with an N-phase second waveform having a frequency $F_M$, comprising:

N number of multiplier circuits, each multiplier circuit having multiply means for multiplying one phase of the first waveform with one phase of the second waveform and for generating first and second currents having a difference which is proportional to a product of the one phase of the first waveform and the one phase of the second waveform; and a load circuit, coupled to the multiplier circuits, having a first node into which the first currents generated by each of the multiplier circuits are summed together to form a first summation current and a second node into which the second currents generated by each of the multiplier circuits are summed together to form a second summation current, the load circuit having a comparing stage for comparing which of the first and second summation currents is larger and for generating a first clock signal having a frequency approximately equal to a frequency of a change in magnitude of the first and second summation currents;

wherein the comparing stage of the load circuit includes, a first transistor coupled to the first node for conducting a first portion of the first summation current;

a second transistor coupled to the second node for conducting a first portion of the second summation current; and a current difference amplifier coupled to the first and second transistors for converting a difference between the first portion of the first summation current and the first portion of the second summation current into the first clock signal;

wherein the current difference amplifier includes, a third transistor having a gate coupled to a gate of the first transistor and forming a first current mirror with the first transistor;

a fourth transistor having a gate coupled to a gate of the second transistor and forming a second current mirror with the second transistor;

a fifth transistor having a drain coupled to a drain of the third transistor; and a sixth transistor having a drain coupled to a drain of the fourth transistor and a gate coupled to a gate of the fifth transistor and forming a third current mirror with the fifth transistor, wherein the first clock signal is generated at the drains of the fourth and sixth transistors.

6. A circuit for modulating an N-phase first waveform having a frequency $F_O$ with an N-phase second waveform having a frequency $F_M$, comprising:

N number of multiplier circuits, each multiplier circuit having multiply means for multiplying one phase of the first waveform with one phase of the second waveform and for generating first and second currents having a difference which is proportional to a product of the one phase of the first waveform and the one phase of the second waveform; and a load circuit, coupled to the multiplier circuits, having a first node into which the first currents generated by each of the multiplier circuits are summed together to form a first summation current and a second node into which the second currents generated by each of the multiplier circuits are summed together to form a second summation current, the load circuit having a comparing stage for comparing which of the first and second summation currents is larger and for generating a first clock signal having a frequency approximately equal to a frequency of a change in magnitude of the first and second summation currents;

wherein the comparing stage of the load circuit includes, a first transistor coupled to the first node for conducting a first portion of the first summation current;

a second transistor coupled to the second node for conducting a first portion of the second summation current;

a current difference amplifier coupled to the first and second transistors for converting a difference between the first portion of the first summation current and the first portion of the second summation current into the first clock signal;

a third transistor coupled to the first node for conducting a second portion of the first summation current; and a fourth transistor coupled to the second node for conducting a second portion of the second summation current.

7. A circuit for modulating an N-phase first waveform having a frequency $F_O$ with an N-phase second waveform having a frequency $F_M$, comprising:

N number of multiplier circuits, each multiplier circuit having multiply means for multiplying one phase of the first waveform with one phase of the second waveform and for generating first and second currents having a difference which is proportional to a product of the one phase of the first waveform and the one phase of the second waveform;

a load circuit, coupled to the multiplier circuits, havin a first node into which the first currents generated by each of the multiplier circuits are summed together to form a first summation current and a second node into which the second currents generated by each of the multiplier circuits are summed together to form a second summation current, the load circuit having a comparing stage for comparing which of the first and second summation currents is larger and for generating a first clock signal having a frequency approximately equal to a frequecy of a change in magnitude of the first and second summation currents; and N number of limited swing driver circuits, each limited swing driver circuit having generator means for generating the one phase of the first waveform in response to one phase of a third N-phase waveform having a frequency $F_O$ and for generating the one phase of the first waveform to have a voltage swing that is less than a voltage swing of the third waveform.

8. A circuit in accordance with claim 7, wherein the generator means of each limited swing driver circuit comprises:

a first CMOS inverter having an output at which the one phase of the first waveform is generated; and means for partially turning on the first CMOS inverter in response to the one phase of the third waveform being high.

9. A circuit in accordance with claim 8, wherein the means for partially turning on the first CMOS inverter comprises:

a first transistor coupled between the output of the first CMOS inverter and an input of the first CMOS inverter;

a second transistor coupled to the input of the first CMOS inverter for pulling the input of the first CMOS inverter high;

a comparator stage coupled to the first and second transistors for turning the first transistor on in response to the one phase of the third waveform being high and for turning the second transistor on in response to the one phase of the third waveform being low.

10. A circuit for modulating an N-phase first waveform having a frequency $F_O$ with an N-phase second waveform having a frequency $F_M$, comprising:

N number of limited swing driver circuits, each limited swing driver circuit having generator means for generating one phase of a third waveform in response to one phase of the first waveform so that the third waveform has a frequency $F_0$ and a voltage swing that is less than a voltage swing of the first waveform;

N number of multiplier circuits, each multiplier circuit coupled to one of the limited swing driver circuits and having multiply means for multiplying one phase of the third waveform with one phase of the second waveform and for generating first and second currents having a difference which is proportional to a product of the one phase of the third waveform and the one phase of the second waveform; and a load circuit, coupled to the multiplier circuits, having a first node into which the first currents generated by each of the multiplier circuits are summed together to form a first summation current and a second node into which the second currents generated by each of the multiplier circuits are summed together to form a second summation current, the load circuit having a comparing stage for comparing which of the first and second summation currents is larger and for generating a first clock signal having a frequency approximately equal to a frequency of a change in magnitude of the first and second summation currents.

11. A circuit in accordance with claim 10, wherein the comparing stage of the load circuit comprises:

a first transistor coupled to the first node for conducting a first portion of the first summation current;

a second transistor coupled to the second node for conducting a first portion of the second summation current; and a current difference amplifier coupled to the first and second transistors for converting a difference between the first portion of the first summation current and the first portion of the second summation current into the first clock signal.

12. A circuit in accordance with claim 11, wherein the current difference amplifier comprises:

a third transistor having a gate coupled to a gate of the first transistor and forming a first current mirror with the first transistor;

a fourth transistor having a gate coupled to a gate of the second transistor and forming a second current mirror with the second transistor;

a fifth transistor having a drain coupled to a drain of the third transistor; and a sixth transistor having a drain coupled to a drain of the fourth transistor and a gate coupled to a gate of the fifth transistor and forming a third current mirror with the fifth transistor, wherein the first clock signal is generated at the drains of the fourth and sixth transistors.

13. A circuit in accordance with claim 11, wherein the comparing stage of the load circuit further comprises:

a third transistor coupled to the first node for conducting a second portion of the first summation current; and a fourth transistor coupled to the second node for conducting a second portion of the second summation current.

14. A circuit in accordance with claim 10, wherein the load circuit further comprises:

an amplifier stage coupled to the comparing stage for amplifying the first clock signal to generate a second clock signal having an increased amplitude.

15. A circuit in accordance with claim 10, wherein the multiply means of each multiplier circuit comprises:

first, second, third and fourth transistors which each have a gate, drain and source, the gates of the first and second transistors being coupled together, the gates of the third and fourth transistors being coupled together, the sources of the first and third transistors being coupled together, and the sources of the second and fourth transistors being coupled together;

wherein the one phase of the second waveform is applied between the gates of the first and third transistors and the one phase of the third waveform is applied between the sources of the first and second transistors;

wherein the drains of the first and fourth transistors conduct the first current and the drains of the second and third transistors conduct the second current.

16. A circuit in accordance with claim 10, wherein the generator means of each limited swing driver circuit comprises:

a first CMOS inverter having an output at which the one phase of the third waveform is generated; and means for partially turning on the first CMOS inverter in response to the one phase of the first waveform being high.

17. A circuit in accordance with claim 16, wherein the means for partially turning on the first CMOS inverter comprises:

a first transistor coupled between the output of the first CMOS inverter and an input of the first CMOS inverter;

a second transistor coupled to the input of the first CMOS inverter for pulling the input of the first CMOS inverter high;

a comparator stage coupled to the first and second transistors for turning the first transistor on in response to the one phase of the first waveform being high and for turning the second transistor on in response to the one phase of the first waveform being low.

18. A modulation circuit, comprising:

N number of limited swing driver circuits, each limited swing driver circuit having a first CMOS inverter having an output at which one phase of a first N-phase waveform having a frequency $F_O$ is generated, each limited swing driver circuit having means for partially turning on the first CMOS inverter in response to one phase of an N-phase second waveform having a frequency $F_O$ in order to generate the one phase of the first N-phase waveform so that it has a voltage swing that is less than a voltage swing of the one phase of the N-phase second waveform;

N number of multiplier circuits, each multiplier circuit coupled to one of the limited swing driver circuits and having multiply means for multiplying one phase of the first N-phase waveform with one phase of a third N-phase waveform having a frequency $F_M$ and for generating first and second currents having a difference which is proportional to a product of the one phase of the first N-phase waveform and the one phase of the third N-phase waveform; and a load circuit, coupled to the multiplier circuits, having a first node into which the first currents generated by each of the multiplier circuits are summed together to form a first summation current and a second node into which the second currents generated by each of the multiplier circuits are summed together to form a second summation current, the load circuit having a first transistor coupled to the tirst node for conducting a tirst portion of the first summation current, a second transistor coupled to the second node for conducting a first portion of the second summation current, and a current difference amplifier coupled to the first and second transistors for converting a difference between the first portion of the first summation current and the first portion of the second summation current into a first clock signal having a frequency approximately equal to a frequency of a change in magnitude of the first and second summation currents.

19. A circuit in accordance with claim 18, wherein the current difference amplifier comprises:

a third transistor having a gate coupled to a gate of the first transistor and forming a first current mirror with the first transistor;

a fourth transistor having a gate coupled to a gate of the second transistor and forming a second current mirror with the second transistor;

a fifth transistor having a drain coupled to a drain of the third transistor; and a sixth transistor having a drain coupled to a drain of the fourth transistor and a gate coupled to a gate of the fifth transistor and forming a third current mirror with the fifth transistor, wherein the first clock signal is generated at the drains of the fourth and sixth transistors.

20. A circuit in accordance with claim 18, wherein the load circuit further comprises:

a third transistor coupled to the first node for conducting a second portion of the first summation current; and a fourth transistor coupled to the second node for conducting a second portion of the second summation current.

21. A circuit in accordance with claim 18, wherein the load circuit further comprises:

an amplifier stage coupled to the comparing stage for amplifying the first clock signal to generate a second clock signal having an increased amplitude.

22. A circuit in accordance with claim 18, wherein the multiply means of each multiplier circuit comprises:

first, second, third and fourth transistors which each have a gate, drain and source, the gates of the first and second transistors being coupled together, the gates of the third and fourth transistors being coupled together, the sources of the first and third transistors being coupled together, and the sources of the second and fourth transistors being coupled together;

wherein the one phase of the third N-phase waveform is applied between the gates of the first and third transistors and the one phase of the first N-phase waveform is applied between the sources of the first and second transistors;

wherein the drains of the first and fourth transistors conduct the first current and the drains of the second and third transistors conduct the second current.

23. A circuit in accordance with claim 18, wherein the means for partially turning on the first CMOS inverter comprises:

a first transistor coupled between the output of the first CMOS inverter and an input of the first CMOS inverter;

a second transistor coupled to the input of the first CMOS inverter for pulling the input of the first CMOS inverter high;

a comparator stage coupled to the first and second transistors for turning the first transistor on in response to the one phase of the second waveform N-phase being high and for turning the second transistor on in response to the one phase of the second N-phase waveform being low.

24. A method of modulating an N-phase first waveform having a frequency $F_O$ with an N-phase second waveform having a frequency $F_M$, comprising the steps of:

generating an N-phase third waveform having a frequency $F_O$ and a voltage swing that is less than a voltage swing of the first waveform;

multiplying each phase of the third waveform with each respective phase of the second waveform;

generating first and second currents with respect to each phase of the multiplied third and second waveforms having a difference which is proportional to a product of the respective phases of the third and second waveforms;

summing together the first currents generated with respect to each phase of the multiplied third and second waveforms to form a first summation current;

summing together the second currents generated with respect to each phase of the multiplied third and second waveforms to form a second summation current;

comparing which of the first and second summation currents is larger; and generating a first clock signal having a frequency approximately equal to a frequency of a change in magnitude of the first and second summation currents.

25. A method in accordance with claim 24, wherein the step of generating the first clock signal comprises the step of:

converting a difference between the first and second summation currents into the first clock signal.

26. A method in accordance with claim 24, wherein the step of generating an N-phase third waveform comprises partially turning on a first CMOS inverter in response to the one phase of the first waveform being high.

* * * * *

UNITED STATES PATENT AND TRADEMARK OFFICE
CERTIFICATE OF CORRECTION

PATENT NO. : 5,708,383
DATED : January 13, 1998
INVENTOR(S) : Johnny Chuang-Li Lee It is certified that error appears in the above-identified patent and that said Letters Patent is hereby corrected as shown below:

In Col. 12, line 39, delete "havin" and replace with --having--.

In Col. 15, line 15, delete "tirst" and replace with --first--.

In Col. 15, line 16, delete "tirst" and replace with --first--.

In Col. 16, line 23, after "second" delete "waveform N-phase" and replace with --N-phase waveform--.

Signed and Sealed this

Twenty-first Day of April, 1998

Attest:

BRUCE LEHMAN

Attesting Officer          *Commissioner of Patents and Trademarks*

UNITED STATES PATENT AND TRADEMARK OFFICE
CERTIFICATE OF CORRECTION

PATENT NO. : 5,708,383
DATED : January 13, 1998
INVENTOR(S) : Johnny Chuang-Li Lee It is certified that error appears in the above-identified patent and that said Letters Patent is hereby corrected as shown below:

On the title page, please insert --[73] Assignee: NATIONAL SEMICONDUCTOR CORPORATION, Santa Clara, CA.--

Signed and Sealed this

Third Day of November, 1998

Attest:

BRUCE LEHMAN

*Attesting Officer*    *Commissioner of Patents and Trademarks*